(12) United States Patent
Matlin et al.

(10) Patent No.: US 9,844,169 B2
(45) Date of Patent: Dec. 12, 2017

(54) KA BAND MULTI-CHIP MODULATOR

(71) Applicant: The Johns Hopkins University, Baltimore, MD (US)

(72) Inventors: Daniel E. Matlin, Severn, MD (US); Sheng Cheng, Laytonsville, MD (US); Seppo J. Lehtonen, Columbia, MD (US); John E. Penn, Eldersburg, MD (US); Perry M. Malouf, Bethesda, MD (US); Matthew P. Angert, Columbia, MD (US); Christopher B. Haskins, Crownsville, MD (US); Avinash Sharma, Laurel, MD (US); Jacob P. Treadway, Lexington, MA (US); Robert E. Wallis, Ellicott City, MD (US)

(73) Assignee: The Johns Hopkins University, Baltimore, MD (US)

( * ) Notice: Subject to any disclaimer, the term of this patent is extended or adjusted under 35 U.S.C. 154(b) by 0 days.

(21) Appl. No.: 14/842,004

(22) Filed: Sep. 1, 2015

(65) Prior Publication Data
US 2016/0126891 A1     May 5, 2016

Related U.S. Application Data

(60) Provisional application No. 62/073,057, filed on Oct. 31, 2014.

(51) Int. Cl.
*H03C 3/02*     (2006.01)
*H05K 9/00*     (2006.01)
*H03H 11/24*     (2006.01)

(52) U.S. Cl.
CPC ............ *H05K 9/0056* (2013.01); *H03C 3/02* (2013.01); *H03H 11/24* (2013.01)

(58) Field of Classification Search
CPC ............ H03C 3/02; H05K 5/06; H03H 11/24
USPC ................. 332/103, 117, 123, 125
See application file for complete search history.

(56) References Cited

U.S. PATENT DOCUMENTS

| | | | | |
|---|---|---|---|---|
| 2,533,496 A | * | 12/1950 | Moore | H03D 3/10 329/338 |
| 4,684,902 A | * | 8/1987 | McGroary | H03B 21/02 331/38 |
| 5,553,076 A | * | 9/1996 | Behtash | H04W 28/26 370/311 |
| 5,983,081 A | * | 11/1999 | Lehtinen | H03J 5/0281 455/179.1 |
| 2002/0065055 A1 | * | 5/2002 | Hattori | H04B 1/18 455/130 |

(Continued)

OTHER PUBLICATIONS

Authors: Wei-Heng Lin, Wei-Lun Chang, Jeng-Han Tsai, and Tian-Wei Huang Title: A 30-60GHz CMOS Sub-harmonic IQ De/Modulator for High Data-Rate Communication System Applications Date: 2009; Publisher: IEEE; Pertinent pp. 462-465.*

(Continued)

*Primary Examiner* — Richard Tan
(74) *Attorney, Agent, or Firm* — Sung T. Kim

(57) ABSTRACT

A multi-chip module is provided including a multiplier configured to multiply a frequency of an input signal into a predetermined Ka-band frequency center channel, a modulator configured to modulate the center channel, and an amplifier configured to amplify a modulated signal for output.

15 Claims, 6 Drawing Sheets

(56) References Cited

U.S. PATENT DOCUMENTS

| | | | | |
|---|---|---|---|---|
| 2003/0152140 | A1* | 8/2003 | Antoniak | G08C 15/12 375/219 |
| 2004/0048588 | A1* | 3/2004 | Ammar | H04B 7/18528 455/130 |
| 2004/0092237 | A1* | 5/2004 | Chen | H03G 3/3042 455/126 |
| 2005/0245103 | A1* | 11/2005 | Ellison | G02B 6/4201 439/61 |
| 2006/0160500 | A1* | 7/2006 | Ammar | H01L 23/04 455/118 |
| 2008/0132193 | A1* | 6/2008 | Petrovic | H04B 1/28 455/323 |
| 2010/0014610 | A1* | 1/2010 | Jaso | H04L 27/2046 375/308 |
| 2011/0193684 | A1* | 8/2011 | Beeler | H04L 27/02 340/10.1 |
| 2015/0137391 | A1* | 5/2015 | Bez | H01L 23/053 257/784 |

OTHER PUBLICATIONS

Authors: Cai Yuxiong, Wu Danyu, Chen Gaopeng, Jin Zhi, and Liu Xinyu Title: Ka-band IQ vector modulator employing GaAs HBTs Date: Jun. 2011, Publisher: Journal of Semiconductors; vol. 32, No. 6.*

* cited by examiner

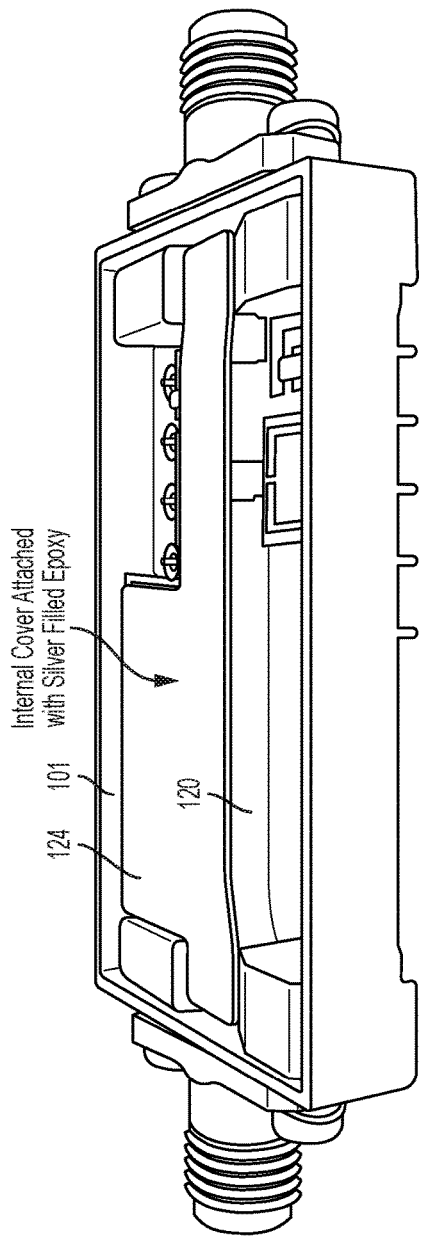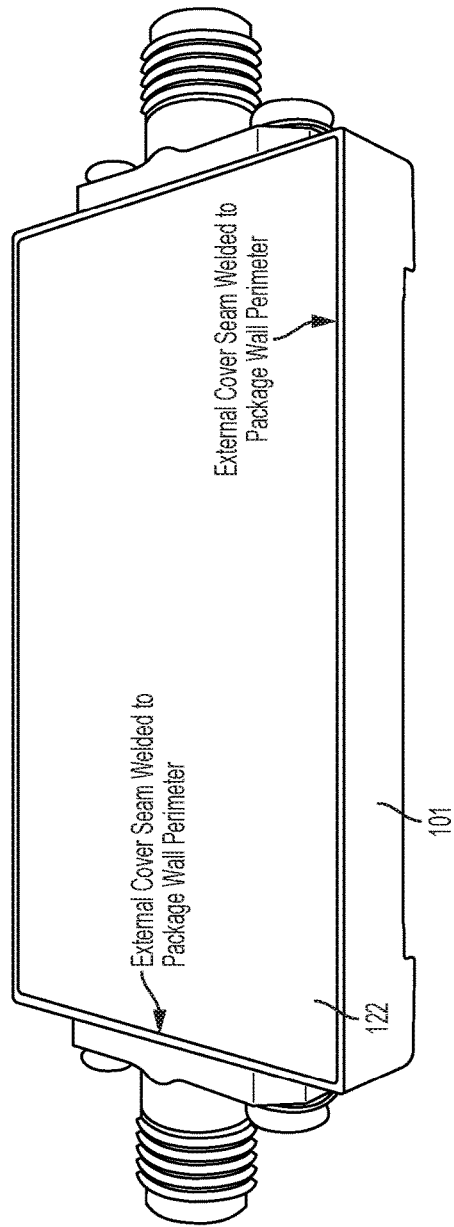
Figure 6A
Figure 6B

KA BAND MULTI-CHIP MODULATOR

CROSS REFERENCE TO RELATED APPLICATIONS

This application claims the benefit of U.S. Provisional Application No. 62/073,057 filed on Oct. 31, 2014, the entire contents of which are hereby incorporated herein by reference.

TECHNICAL FIELD

Example embodiments generally relate to Radio Frequency modulation and, in particular, relate to a Ka band multi-chip modulator.

BACKGROUND

Typical high frequency multi-chip modulators (MCMs) may utilize a mixer to convert a low frequency input signal to the desired high frequency output signal. The mixer, however may require a significant power supply and require multiple electronic components to accomplish up mixing to the desired frequency. Each additional component of the MCM may have space, weight, and power considerations, and may increase the probability of a failure of the MCM.

The typical high frequency MCMs may modulate the input signal prior to mixing the signal to the high frequency. The modulation may be carried through the mixer to the high frequency output signal. Modulation of the low frequency signal prior to mixing the signal to the high frequency output signal may require complex circuitry, with significant power requirements, and may cause signal spurs due to local oscillator (LO) generation.

BRIEF SUMMARY OF SOME EXAMPLES

Accordingly, some example embodiments may enable a Ka band MCM, as described below. In one example embodiment, a multi-chip module is provided including a multiplier configured to multiply a frequency of an input signal into a predetermined Ka-band frequency center channel, a modulator configured to modulate the center channel, and an amplifier configured to amplify a modulated signal for output.

In yet another example embodiment, a multi-chip module is provided including a multiplier configured to multiply the frequency of an input signal into a predetermined Ka-band frequency center channel, a modulator configured to modulate the center channel, a filter configured to smooth the center channel or filter out unwanted harmonics, an amplifier configured to amplify a modulated signal for output, and a hermetically sealable case. The hermetically sealable case includes a waveguide channel configured to suppress waveguide mode propagation, and an internal cover sealing the wave guide channel. The multiplier, modulator, filter, and amplifier are disposed within the wave guide channel.

BRIEF DESCRIPTION OF THE SEVERAL VIEWS OF THE DRAWING(S)

Having thus described the invention in general terms, reference will now be made to the accompanying drawings, which are not necessarily drawn to scale, and wherein:

FIG. 6A illustrates an example Ka band MCM with the internal cover installed according to an example embodiment of the present invention.

FIG. 6B illustrates an example Ka band MCM with the external cover installed according to an example embodiment of the present invention.

DETAILED DESCRIPTION

Figure 1:
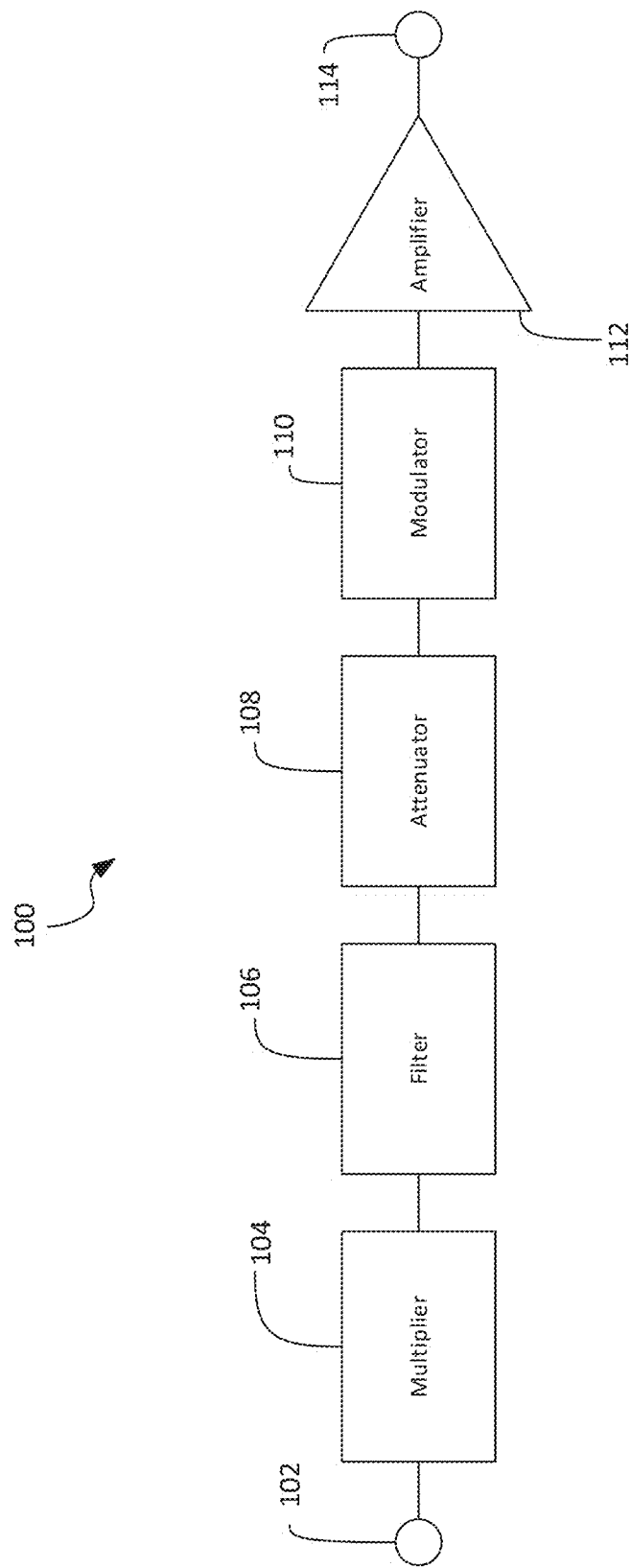
FIG. 1 illustrates an example block diagram of a Ka band MCM according to an example embodiment of the present invention.

Some example embodiments now will be described more fully hereinafter with reference to the accompanying drawings, in which some, but not all example embodiments are shown. Indeed, the examples described and pictured herein should not be construed as being limiting as to the scope, applicability or configuration of the present disclosure. Rather, these example embodiments are provided so that this disclosure will satisfy applicable legal requirements. Like reference numerals refer to like elements throughout.

In some examples, the present invention may provide a Ka band MCM. The Ka band MCM may be configured to multiply up from a low frequency input to a Ka band (26.5-40 GHz) signal for modulation and output. The utilization of a multiplier instead of the standard mix up allows for a less complex design with fewer components. The reduction in components may reduce the size and power consumption of the MCM, and increase reliability. In an example embodiment the power consumption may be </=0.5 W. The Ka band MCM may also modulate the high frequency output signal directly instead of modulation prior to increasing the frequency to the desired output frequency. The direct modulation of the high frequency output signal may have less spurs, lower power consumption, fewer components, and be less complicated than modulation prior to increasing the frequency.

The Ka band MCM may be configured with a wave guide channel configured to suppress waveguide mode propagation. The Ka band MCM may be hermitically sealed and/or include one or more getters to prevent entry and/or absorb foreign materials or gases in the MCM.

The Ka band MCM may include one or more attenuators to flatten the total gain across components of the MCM across a wide temperature range.

The reduction in components, power, size, and over all complexity of the MCM may allow for deployment in harsh environments, e.g. extreme heat, cold, radiation exposure, or the like, with little or no repair support, such as space. In an example embodiment, the Ka band MCM may be configured to operate in a temperature range of −25 C to +70 C and may include a survivability temperature range of −35 C to +75 C and a maximum storage temperature of 85 C. The MCM may have a total mass of </=30 g.

Further, the hermetical sealing and utilization of getters may prevent or limit damage or degradation of the MCM from foreign materials or gases.

Example Ka Band MCM Block Diagram

An example embodiment of the invention will now be described in reference to FIG. 1, which illustrates an example Ka band MCM in which an embodiment of the present invention may be employed. FIG. 1 illustrates an example block diagram of a Ka band MCM according to an example embodiment of the present invention. The MCM may include an input 102 a multiplier 104, a filter 106, an attenuator 108, a modulator 110, an amplifier 112, and an output 114.

The MCM may receive an input signal at the MCM input 102. The input signal may be an X band signal, such as 8 GHz. In some embodiments, the input may be about 7.950-8.075 GHz with a nominal channel assignment of 8.00973147825 GHz. The input 102 may have an impedance of about 50Ω, a voltage standard wave ratio of </=1.5:1, and a power of 11 dBm+/−2 dB. The input 102 may be a pin connector which passes the input signal to the multiplier 104 through an electrical connection, such as a substrate.

The multiplier 104 may a linear frequency multiplier configure to multiply an input frequency by a predetermined factor, such as 3, 4, 5 or the like. The multiplier 104 may be a monolithic microwave integrated circuit (MMIC) with a multiplier factor of 4. In an example embodiment in which the the input signal is about 8 GHz, the output of the multiplier 104 may be a center channel frequency of about 32 GHz. The multiplier 104 may pass the high frequency signal to the filter 106.

The filter 106 may be configured to smooth the center channel frequency at the desired center channel frequency, e.g. a selected frequency between 23 and 33 GHz, such as 32 GHz, and/or filter out unwanted harmonics from the multiplier 104. In an example embodiment, the center channel frequency may be filtered to about 31.8-32.2 GHz with a nominal channel assignment of 32.038925917 GHz. The filter 106 may be a microwave bandpass filter, such as a coupled line filter, distributed element filter, parallel line filter, or the like. The filter 106 may pass the filtered high frequency signal to an attenuator 108.

The attenuator 108 may be a temperature compensation attenuator configured to flatten a total gain of the modulator 110. Additionally or alternatively, an attenuator 108 may be placed prior to the filter and/or after the modulator to attenuate total gain of the multiplier, filter or the like. The attenuator 108 may pass the signal to the modulator 110.

The modulator 110 may modulate the center channel frequency. The center channel frequency modulation may be an I/Q baseband modulation. In an example embodiment, the modulator 110 may modulate at a bandwidth of >/=100 MHz, −3 dB at each baseband input, for example the I/Q modulation bandwidth may be 300 MHz. The modulation may have a I/Q phase imbalance of </=3 degrees and a I/Q gain imbalance of </=+/−0.25 dB. The I/Q input may be DC-coupled differential inputs. The modulator 110 may pass the modulated high frequency signal to the amplifier 112.

The amplifier 112 may be a buffer amplifier and may be configured to provide electrical impedance transformation from the MCM to a transmission circuit connected to the MCM output 114. The output 114 may have an impedance of 50Ω, a VSWR of </=1.5:1, a power of +8 dBm+1-1.5 dB over fc+/−50 MHz, and spurious harmonics </=40 dBc.

Example Ka Band MCM Schematic

Figure 2:
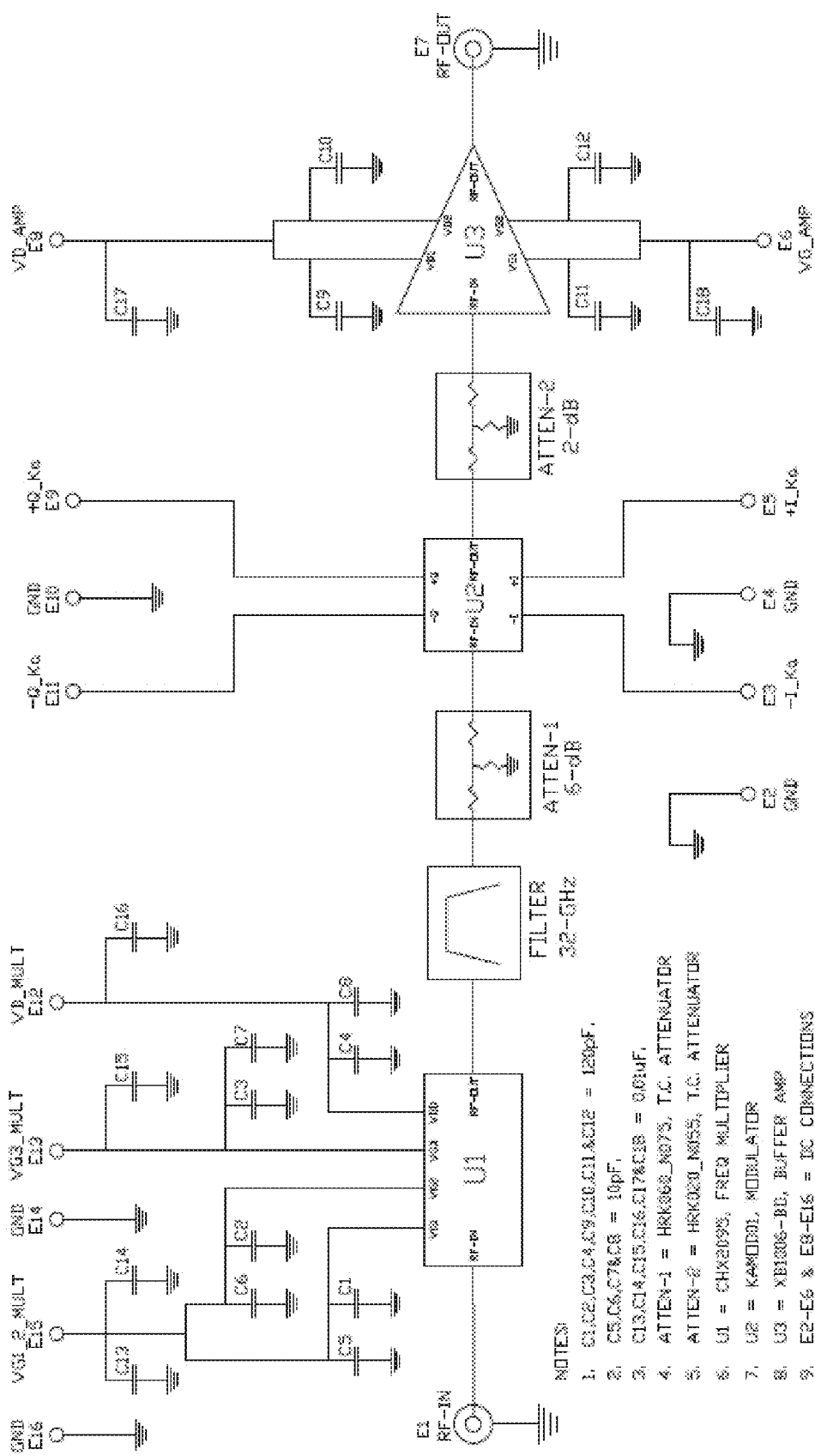
FIG. 2 illustrates an example schematic of a Ka band MCM according to an example embodiment of the present invention.

FIG. 2 illustrates an example schematic of a Ka band MCM according to an example embodiment of the present invention. The input signal may enter the MCM circuit at E1 RF-IN. and be passed to the RF-In of U1. U1 is a frequency multiplier, such as CHX2095 made by United Monolithic semiconductors. U1 may be connected to a capacitor bank including capacitors C1-C1-C8 and C13-C16. Capacitors C1-4 have a capacitance of 120 pf, and capacitors C5-C8 have a capacitance of 10 pf, and capacitors C13-C16 have a capacitance of 0.01 uf. U1 may receive the input signal of about 8 GHz and multiply the input signal by a factor of 4 to approximately 32 GHz.

U1 passed the high frequency signal to the filter through a wire bond in an alumina substrate. The filter is a 32-GHz band pass filter. The filter passed the filtered signal to the Attenuator Atten-1 a wire bond in an alumina substrate. Atten-1 may be a 6 dB temperature compensation attenuator, such as a variable attenuator HRK060_N075 manufactured by EMC Technology. Atten-1 may be configured to flatten the total gain of the multiplier to compensate for changes in temperature of the MCM. Atten-1 may pass the high frequency signal to the modulator U2 through a wire bond in an alumina substrate. U2 may be a custom vector modulator MMIC chip, such as KaMod01 designed by JHU Applied Physics Lab.

The modulator U2 may receive modulation I/Q inputs and modulate the I and Q data directly into the carrier signal in the Ka frequency band. In an example embodiment, the carrier wave, e.g. the filtered high frequency signal received from the attenuator Atten-1, enters U2 and passes through a lange coupler which may separate in-phase and quadrature, e.g. −90 degree phase, components of the carrier wave. The separated components then go through a variable attenuator controlled by the I and Q signals. The components may then be summed using a Wilkinson combiner. Each of the variable attenuators uses a lange coupler with the through and coupled ports terminated by a field effect transistor (FET) in a switch configuration. The voltage applied to the gate of the FET may be varied to change the FET's terminating resistance from low, e.g. near zero, to high, e.g. thousands of ohms, which may cause the input signal to pass out of the normally isolated port of the lange coupler with a magnitude and phase dependent on the impedance presented by the FET at the thru and coupled ports. The modulator may implement a balanced variable attenuator configuration, which may consist of four lange couplers, four FET switch devices and complementary control. The modulator U2 may pass the modulated signal to a second attenuator Atten-2. Atten-2 may be a 2 db temperature compensation attenuator, such as variable attenuator HRK020_N055 manufactured by EMC Technology. Atten-2 may be configured to flatten the total gain of the modulator to compensate for changes in temperature of the MCM. Atten-2 may pass the modulated signal to the amplifier U3 through a wire bond in an alumina substrate.

The amplifier U3 may receive the modulated signal and provide electrical impedance transformation for a transmission circuit connected to E7 RF-OUT. The amplifier U3 may be a three stage buffer amplifier, such as XB 1006-BD manufactured by MACOM. The amplifier U3 may electrically connected to a capacitor bank including capacitors C9-C12 and C17-C18. Capacitors C9-C12 may have a capacitance of 120 pf and capacitors C17 and C18 may have a capacitance of 0.01 uf. The amplifier U3 may pass the output signal to the transmission circuit connected to E7 RF-OUT.

Example Ka Band MCM

Figure 3:
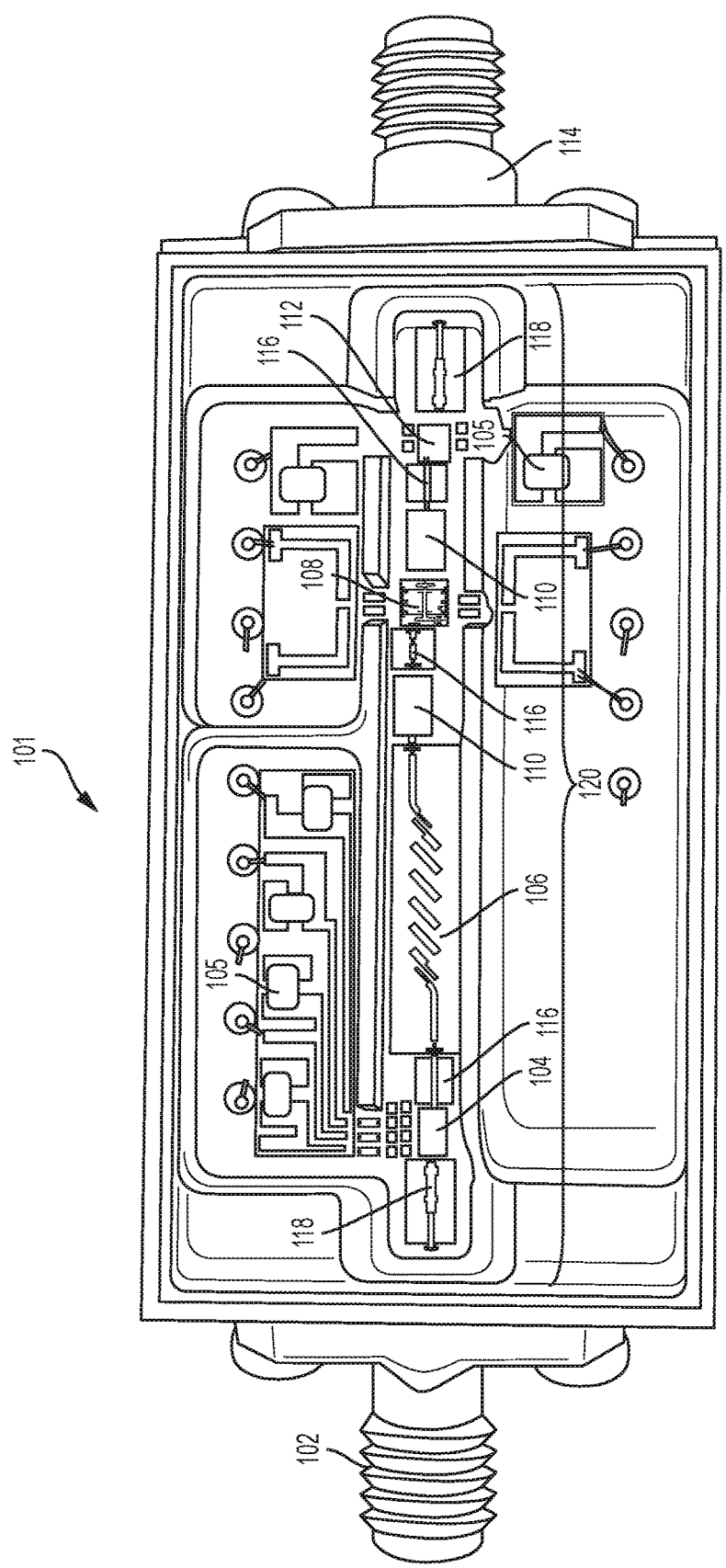
FIG. 3 illustrates an example Ka band MCM with external cover removed according to an example embodiment of the present invention.

FIG. 3 illustrates an example Ka band MCM with external cover removed according to an example embodiment of the present invention. The MCM may include a case 101, an input 102, beryllium oxide substrates 118, multiplier 104, alumina substrates 116, filter 106, attenuators 110, modulator 108, amplifier 112, an output 114, waveguide channel 120.

The input may extend from the case 101 at a first position. The input 102 may include a RF connector, a pin and a glass seal. The pin may be connected via eutectic solder to the beryllium oxide (BeO) substrate 118. The BeO substrate 118 may be electrically connected, such as by a gold wire, to the multiplier 104. The multiplier 104 may be connected to a plurality of capacitors 105. The multiplier 104 may also be electrically connected to an alumina substrate 116 through a gold wire, which is in turn electrically connected to the filter 106 through a gold wire.

The filter 106 may be electrically connected to a temperature compensation attenuator 110 through a gold wire. The attenuator 110 may be electrically connected to an alumina substrate through a gold wire which in turn is electrically connected to the modulator 108. The modulator 108 may be electrically connected to a second attenuator 110 through gold wire.

The second attenuator 110 may be electrically connected to a alumina substrate 116 through a gold wire, which may in turn be connected to the amplifier 112. The amplifier 112 may be connected to a plurality of capacitors 105 and to a BeO substrate 118. The BeO substrate may be electrically connected to the output 114. The output 114 may include an RF connector, a pin, and a glass seal. The pin may be connected via eutectic solder to the BeO substrate 118.

The case 101 may be constructed of an alloy with thermal expansion properties similar to borosilicate glass, such as Kovar. The Kovar case may be nickel and/or gold plated to prevent corrosion.

The case 101 may include a waveguide channel 120 in which, at least the multiplier 104, filter 106, the attenuators 110, the modulator 108, and the amplifier 112 are disposed. The waveguide channel 120 may be configured to pass the operating frequency, e.g. 32 GHz, and limit or suppress waveguide mode propagation, e.g. <40 GHz. The waveguide channel 120 may be closed to seal the wave guide channel by an internal cover, as discussed in FIG. 4. Similarly, the case may be closed or sealed by installing external cover, as discussed in FIG. 4.

Figure 4:
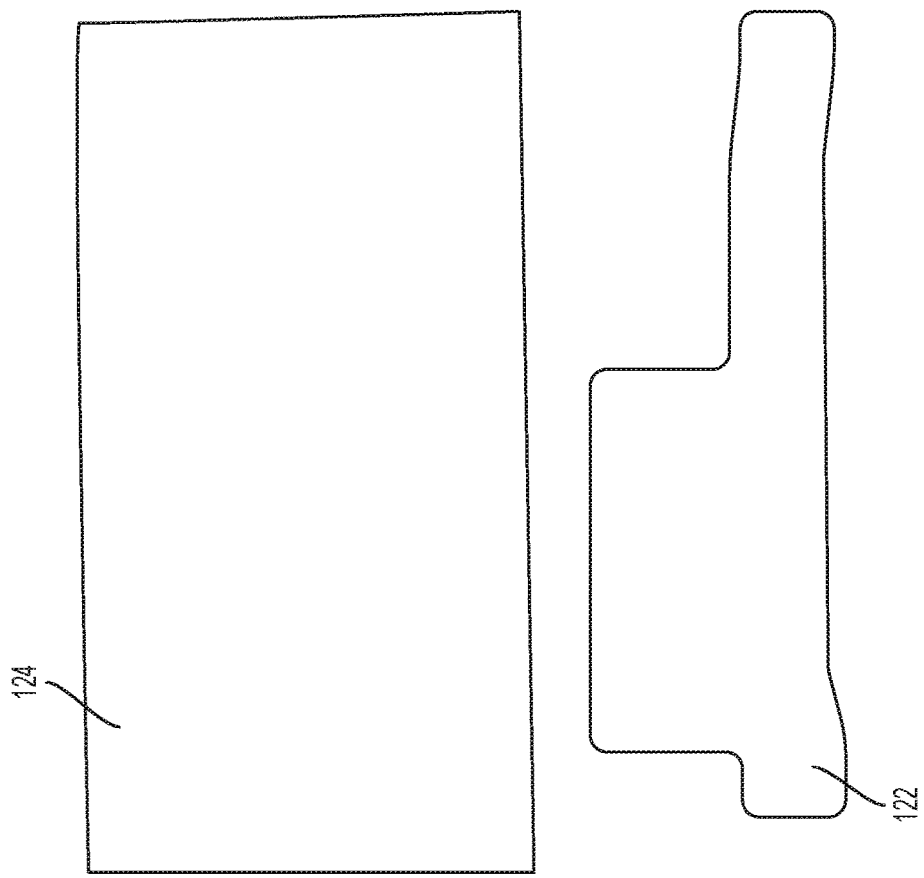
FIG. 4 illustrates an example Ka Band MCM internal cover and external cover according to an example embodiment of the present invention.

FIG. 4 illustrates an example Ka Band MCM internal cover and external cover according to an example embodiment of the present invention. The case 101 may include internal cover 122 and external cover 124. The internal cover 122 and external cover 124 may be manufactured of Kovar and may also include the nickel and/or gold plating. The internal cover 122 may close or seal the waveguide channel 120 and in some instances the area including at least some of the capacitors 105.

The external cover 124 may close or seal the exterior of the case 101 from the environment. In some example embodiments, the internal cover 122 and/or the external cover may be hermetically sealed, as discussed in FIG. 6.

Figure 5:
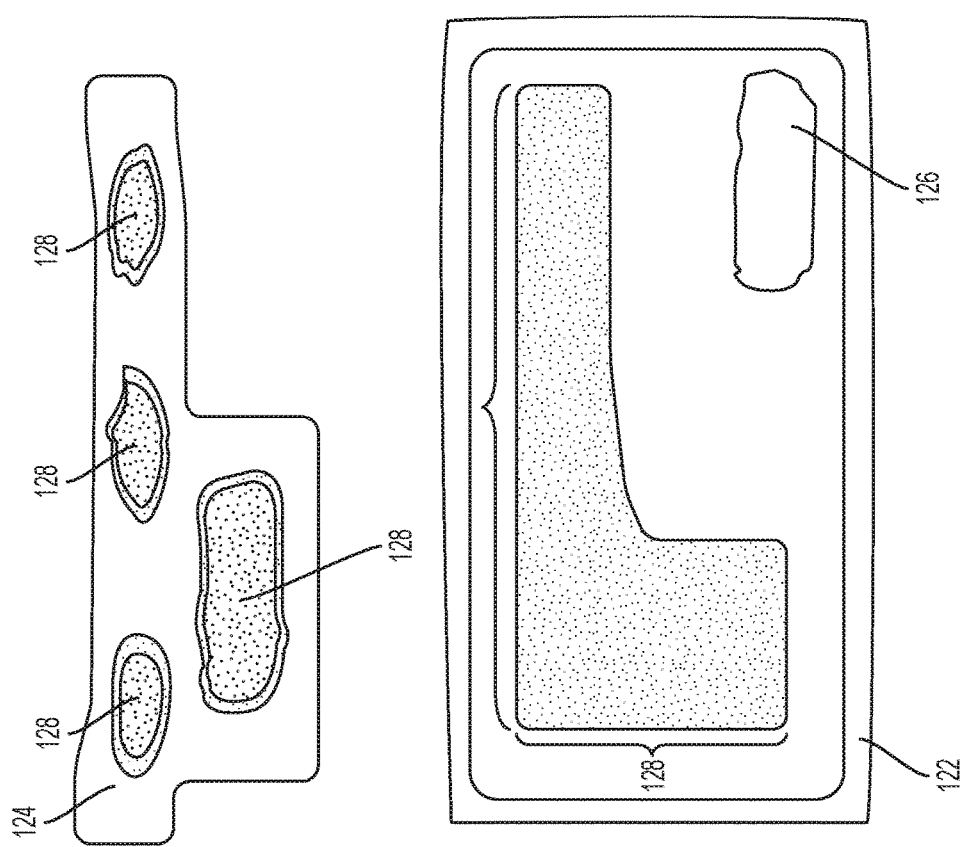
FIG. 5 illustrates an example KA band MCM internal cover and external cover with getters according to an example embodiment of the present invention.

FIG. 5 illustrates an example KA band MCM internal cover and external cover with getters according to an example embodiment of the present invention. In an example embodiment, the internal cover 122 and/or external covers may include one or more getters to absorb or trap foreign particles or gases within the case 101. The getters may include particle getters, moisture getters, and/or hydrogen getters. In an example embodiment the internal cover 122 may include a particle and moisture getter 128 applied to the internal side of the internal cover. The particle and moisture getter may be a tacky material which, when cured functions as a particle and moisture getter, such as GA2000-2 manufactured by Cookson Electronics. The Particle and moisture getter 128 may be applied in a thin layer, such as </=0.01 inches of gel on the inside surface of the internal cover 122. Loose particles may adhere to the gel.

In an example embodiment, a particle and moisture getter 128 may be applied to the inside surface of the external lid 124.

In some example embodiments, a hydrogen and moisture getter 126 may be applied to the inside surface of the external cover 124. The hydrogen and moisture getter 126 may be a moldable material formed into a film, such as H2-3000 manufactured by Cookson Electronics. The hydrogen and moisture getter 126 may have a high hydrogen and/or moisture getter capacity, and may be designed to maintain hydrogen atmosphere of less than 1 part per million (ppm) within the MCM case 101. In an example embodiment, a small piece of hydrogen and moisture getter 126, e.g. 0.15×0.4×0.01 inches, can absorb >1.15 cc of Hydrogen gas. The hydrogen and moisture getter 126 may be attached to the inside surface of the external cover with RTV (room temperature vulcanization) adhesive.

FIG. 6A illustrates an example Ka band MCM with the internal cover installed according to an example embodiment of the present invention. In an example embodiment, the internal cover 122 may close or seal the waveguide channel 120. The internal cover 122 may be sealed in place by a weld or epoxy, such as silver filled epoxy. In an example embodiment, the seal of the internal cover 122 may be a hermetical seal of the waveguide channel 120.

FIG. 6B illustrates an example Ka band MCM with the external cover installed according to an example embodiment of the present invention. In an example embodiment, the external cover 124 may close or seal the case 101 of the MCM. The external cover 124 may be sealed in place by an epoxy or a weld, such as a seam weld on the package, e.g. case 101, wall. In an example embodiment, the seal of the external cover 124 may be a hermetical seal of the case 101.

In some embodiments, the Ka-band MCM may be further configured for optional modifications. In this regard, for example the amplifier is a buffer amplifier. In an example embodiment, the multi-chip module also includes a filter configured to smooth the center channel or filter out unwanted harmonics. In some example embodiments, the multi-chip module also includes an attenuator configured to flatten a total gain of the modulator across a predetermined temperature range. In an example embodiment, the multi-chip module also includes a plurality of attenuators configured to flatten a total gain of the multiplier or modulator across a predetermined temperature range. In some example embodiments, the multi-chip module also includes a waveguide channel configured to suppress waveguide mode propagation. In an example embodiment, the multiplier, modulator, and amplifier are disposed within the waveguide channel. In an example embodiment, the multi chip module also includes a hermetically sealable case. The multiplier, modulator, and amplifier are disposed within the hermetically sealable case. In some example embodiments, the multi-chip module also includes at least one getter disposed within the hermetically sealable case. In an example embodiment, the at least one getter is a hydrogen getter. In some example embodiments, getter is a moisture getter. In some example embodiments, the at least one getter is a particle getter. In an example embodiment, the hermetically sealable case includes a waveguide channel configured to cutoff low order modes, and an internal cover sealing the wave guide channel. The multiplier, modulator, and amplifier are disposed within the wave guide channel. In some example embodiments, the hermetically sealable casing is fabricated from Kovar. In an example embodiment, the center channel is about 23-33 GHz. In some example embodiments, the input signal is X-band.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Moreover, although the foregoing descriptions and the associated drawings describe exemplary embodiments in the context of certain exemplary combinations of elements and/or functions, it should be appreciated that different combinations of elements and/or functions may be provided by alternative embodiments without departing from the scope of the appended claims. In this regard, for example, different combinations of elements and/or functions than those explicitly described above are also contemplated as may be set forth in some of the appended claims. In cases where advantages, benefits or solutions to problems are described herein, it should be appreciated that such advantages, benefits and/or solutions may be applicable to some example embodiments, but not necessarily all example embodiments. Thus, any advantages, benefits or solutions described herein should not be thought of as being critical, required or essential to all embodiments or to that which is claimed herein. Although specific terms are employed herein, they are used in a generic and descriptive sense only and not for purposes of limitation.

That which is claimed:

1. A multi-chip module comprising:
   an input configured to receive an input signal;
   a multiplier configured to multiply a frequency of the input signal and output a Ka-band frequency center channel;
   a modulator configured to directly modulate the Ka-band frequency center channel via I/O baseband modulation, wherein modulation of the Ka-band frequency center channel comprises receiving modulation data including in-phase and quadrature data and modulating the in-phase and quadrature data directly into the Ka-band frequency center channel;
   a filter configured to smooth the Ka-band frequency center channel and filter out unwanted harmonics;
   an amplifier configured to amplify a modulated signal for output;
   a first attenuator disposed between the filter and the modulator; and
   a second attenuator disposed between the modulator and the amplifier, wherein the first attenuator and the second attenuator are configured to flatten a total gain of the modulator, filter, or multiplier across a predetermined temperature range.

2. The multi-chip module of claim 1, wherein the amplifier is a buffer amplifier.

3. The multi-chip module of claim 1 further comprising:
   a waveguide channel configured to suppress waveguide mode propagation.

4. The multi-Chip module of claim 3, wherein the multiplier, modulator, and amplifier are disposed within the waveguide channel.

5. The multi-chip module of claim 1 further comprising:
   a hermetically sealable case,
   wherein the multiplier, modulator, and amplifier are disposed within the hermetically sealable case.

6. The multi-chip module of claim 5 further comprising:
   at least one getter disposed within the hermetically sealable case.

7. The multi-chip module of claim 6, wherein the at least one getter is a hydrogen getter, a moisture getter, or a particle getter.

8. The multi-chip module of claim 5, wherein the hermetically sealable case comprises:
   a waveguide channel configured to suppress waveguide mode propagation, and
   an internal cover sealing the wave guide channel, and
   wherein the multiplier, modulator, and amplifier are disposed within the wave guide channel.

9. The multi-Chip module of claim 5, wherein the hermetically sealable casing is fabricated from Kovar.

10. The multi-chip module of claim 1, wherein the Ka-band frequency center channel is about 23-33 GHz.

11. The multi-chip module of claim 1, wherein the input signal is X-band.

12. The multi-chip module of claim 1, wherein the modulator includes a lange coupler configured to separate the in-phase data and the quadrature data from the Ka-band frequency center channel.

13. A multi-chip module comprising:
   an input configured to receive an input signal;
   a multiplier configured to multiply a frequency of the input signal and output a Ka-band frequency center channel;
   a modulator configured to directly modulate the Ka-band frequency center channel via I/Q baseband modulation, wherein modulation of the Ka-band frequency center channel comprises receiving modulation data including in-phase and quadrature data and modulating the in-phase and quadrature data directly into the Ka-band frequency center channel;
   a filter configured to smooth the Ka-band frequency center channel and filter out harmonics;
   an amplifier configured to amplify a modulated signal for output;
   a hermetically sealable case, wherein the hermetically sealable case comprises:
      a waveguide channel configured to suppress waveguide mode propagation, and
      an internal cover sealing the wave guide channel, and
      wherein the multiplier, modulator, filter, and amplifier are disposed within the wave guide channel;
   a first attenuator disposed between the filter and the modulator; and
   a second attenuator disposed between the modulator and the amplifier, wherein the first attenuator and the second attenuator are configured to flatten a total gain of the modulator, filter, or multiplier across a predetermined temperature range.

14. The multi-chip module of claim 13 further comprising:
   at least one getter disposed within the hermetically sealable case,
   wherein the at least one getter comprises a hydrogen getter, a moisture getter, or a particle getter.

15. The multi-chip module of claim 13, wherein the Ka-band frequency center channel is about 23-33 GHz.

* * * * *